United States Patent Office 3,716,390

Patented Feb. 13, 1973

3,716,390

PHOTORESIST METHOD AND PRODUCTS PRODUCED THEREBY

Victor Charles Garbarini, Bethlehem, Pa., assignor to Bell Telephone Laboratories, Incorporated, Murray Hill, N.J.

No Drawing. Continuation-in-part of abandoned application Ser. No. 783,770, Dec. 13, 1968. This application May 27, 1970, Ser. No. 41,075

Int. Cl. B44d *1/02*

U.S. Cl. 117—34 11 Claims

ABSTRACT OF THE DISCLOSURE

The adherence of photoresist materials to many substrates is improved by use of a substrate primer of an ionic complexed compound capable of carrying an appropriate organo group for reaction with the photoresist, and capable of electrostatically migrating to the substrate for the formation of strong chemical bridges therewith.

CROSS REFERENCE TO RELATED APPLICATION

This application is a continuation-in-part of a copending application, Ser. No. 783,770, filed Dec. 13, 1968, now abandoned.

BACKGROUND OF THE INVENTION

This invention relates to an improved photoresist method for forming patterns on substrates and to the products produced thereby. More particularly, it relates to methods employing photoresists which contain coupling agents to promote their adhesion to substrates.

In the manufacture of planar electronic devices, it is often necessary to process only a select portion of a substrate surface. One example is in the manufacture of printed circuits, where the material which forms the necessary circuit paths is placed in the appropriate pattern on the surface of a supporting body. Another example is found in the production of planar semiconducting devices where it is desired to etch the surface at only select areas. These procedures commonly utilize a photoresist method to provide the means for exposing only the selected surface areas to the particular process employed, e.g., electrodeposition, etching, etc. The process is made selective by providing the substrate surface with a protective material in the form of a desired pattern, so that the process will not be free to operate on the substrate surface everywhere. The protective material thus prevents electrodeposition, etching, etc., at those surface areas beneath the pattern.

Basically, certain photoresist materials upon exposure to light undergo chemical change of a nature such that they are rendered essentially insoluble (or soluble) in a particular solvent which is a good (or poor) solvent for unexposed photoresist. By selectively exposing a photoresist-covered substrate to light through a light-mask, and by "developing" the resist with the appropriate solvent, only that portion of the resist which was exposed remains on (or is removed from) the surface. The remaining pattern of photoresist is known as the "relief pattern." After further processing steps are completed, the relief pattern is removed as well.

In order for the relief pattern to be effective it must adhere strongly to the substrate during the resist development and electrodeposition or etch stages. Loosely adhering resists allow electrolytic or etchant solution to infiltrate in between the relief pattern and the substrate thereby causing irregularities which destroy the sharpness of the desired substrate pattern, and reduce production yields.

Requisite acuity is difficult to attain for dimensions on the order of $10^{-4}$ inches and less. At these dimensions the solution infiltration all but obliterates the pattern sought to be deposited or etched on the substrate. At greater dimensions, the problem still obtains although it is usually confined more to the edges of the pattern with increasing pattern size. In addition, when the substrate has been doped with diffused impurities, such as with the precious metals, the adherence of the relief pattern is generally markedly poorer at all dimensions. Certain substrates prove to be ones to which it is most difficult for resists to adhere. These include $Al_2O_3$, $SiO_2$, especially hydrophilic $SiO_2$, oxidized silicon containing traces of materials such as gold, and the oxides of phosphorus, boron, and aluminum and silicon nitride; metals themselves, for instance Au and Pt, mixtures thereof including mixed compounds, and other materials.

One possible solution to the problem is the utilization of a bonding material to improve adhesion between the photoresist material and the substrate.

SUMMARY OF THE INVENTION

In accordance with the present invention, an improved method of producing adherent relief patterns, especially on particularly difficult substrates, has been found by which excellent acuity may be attained, even at small dimensions. The method entails the use of organic-Werner type complexed compounds which are capable of chemically bonding both with the substrate and the resist material to effect better adherence. By Werner-type complex is meant a compound having at least one atom capable of forming coordination bonds with other atoms or substituents. The complexed compound in solution is ionic, and first is bonded to the substrate by electrostatic forces only. Thereafter, it reacts with the substrate by application of heat, forming a strong chemical linkage to the complexing element of the compound. Because they can be rendered ionic, the complex compounds described herein are exceptionally advantageous over other possible bonding agents on metal or metal-containing substrates, as well as on hydrophilic materials in general. Their ionic nature allows the complexes to be easily absorbed onto negatively charged sites of the substrates and to displace surface moisture despite the latter's affinity for the substrate. It is believed that this displacement of water from the surface contributes greatly to the improved adhesion observed.

The organic substituent of the complex is left available for subsequent reaction with the photoresist, which is then applied. By giving proper attention to the amount of water and concentration of the complex solution and to the thickness of the bound layer, it is possible to achieve uniform etch rates, production reproducibility and easy removal of the developed resist pattern after completion of processing. Ideally, a monolayer of the complex at the substrate is all that is necessary. Preferably, the water concentration is maintained at at least one percent (vol. percent) with a concentration of the complex from approximately 0.1 to 1.0 (wt. percent). In some applications, lower concentrations of the complex down to 0.1 wt. percent may be used as, for example, where less adherence is acceptable but subsequent removal of the complex is a problem. In addition, it is preferable that the pH of the complex solution after the proper concentration of water is obtained, not exceed 6 to avoid unwanted precipitation of the complexed material from solution.

The bonded complex can improve adherence of both negative and positive photoresists.

DETAILED DESCRIPTION OF THE INVENTION

Exemplary of the organic Werner complexes under discussion is the methacrylic acid derivative of chromic chloride, whose formula can be given as:

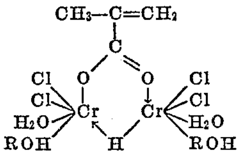

where ROH is the organic solvent for the complex, typically a lower alkyl alcohol such as isopropanol, and where arrowhead bonds are coordination bonds.

When in organic solution, the complex is neutral. The addition of water to this solution, as practiced herein, renders at least some of the complexed molecules cationic (and hence capable of migrating under electrostatic influences). The cations formed are rapidly adsorbed onto polar sites of the substrate where they are held by electrostatic forces. These sites are found on various common substrate materials including $SiO_2$; boron oxide, phosphorous oxide; alumina; alumino-silicate; and metals.

It is widely believed that surface water is a prime factor in causing loosely adherent resist patterns. In fact it is commonplace to find, even in large comercial facilities, substantial efforts aimed at maintaining a fairly low level of relative humidity at resist-formation stations. In contrast, therefore, it seems incongruous that the inventive method should call for the addition of water to the bonding complex for improvement of adherence. An explanation of this anomaly can be theorized, however, if one considers that surface water is probably at best held only by relatively weak "hydrogen bonding" and that the strongly attractive cation complex (which requires water for its formation) competes with surface water and displaces it to render it less able to interfere with the adhesion of the photoresist. The inclusion of the minimum required water is not a problem under ordinary conditions since it is taken up from the surface and/or the atmosphere during the air drying step. For example, the use of isopropanol as the diluent has permitted the required ionization of the complex and has resulted in monolayer adsorption on the surface being treated.

Once absorbed onto the surface sites, an even stronger complex-surface bond is established by the formation of oxo linkages, i.e., a bond through an -O- link. Oxo linkages can be formed between molecules of the complex, in a cross-linking fashion, such as Cr-O-Cr, and between the complex and the surface, for instance Cr-O-Si.

Accordingly, upon formation of the oxo linkages, the complexed material forms as a layer on the substrate surface. The nature of this reaction probably results in an orientation of the organic portion of the complex outward from the substrate, thereby making it readily available to couple with the photoresist.

The formation of these strong chemical bonds and elimination of excess water is aided by the application of some heat, typically at temperatures about 100 to 180° C. These temperatures, however, are not critical. Lower temperatures require longer times for complete reaction, while higher temperatures may begin decomposition of the complex. It is preferable, though not essential, that the application of heat be carried out under an oxygen-less atmosphere, since oxygen can have some degradative effect on the bonded complex, probably by reacting with the organic portion of it that is orinented away from the substrate. A nitrogen ambient, for example, will suffice.

The pH of the initial organic solution of the complex is affected by the addition of water needed for the formation of the organic cation. When water is used as the principal solvent in preparing a suitably diluted solution of the organic complex, the pH of the solution is typically 3 to 4, and it is possible to raise the pH by addition of dilute solutions of ammonium hydroxide. With the relatively little water that is needed for this purpose (one percent by volume is quite adequate), the pH initially decreases. However, should larger quantities be used so that water is present in excess of that needed to ionize all of the complex, it should be expected that the pH should, after passing through a minimum, rise to be ultimately that of a much diluted ionic solution. Although no critical pH range exists for success of the invention, there is a preferred maximum pH above which the build-up of cross-linked complex upon the substrate can interfere with later steps of resist development and/or substrate processing. The same is true for the concentration of the complex. The preferable maxima are a pH of about 6, and a concentration of about 1.0 weight percent. On the other hand, the desired effect of increased adherence is less pronounced when less than about one percent (by volume) water is present and concentration of the complex is under 0.1 weight percent, and, accordingly, these values are preferable minima. However, in some practices of the invention, concentrations of the complex as low as 0.01 wt. percent are used in order to facilitate subsequent removal of the complex from the treated surface.

After adjustment of concentration by the addition of water or other water-miscible solvent, the solution is applied to the substrate and a uniform layer is produced, for example, by spinning. The electrical charge of the complexed molecule insures uniform coverage of active surface sites. Then the coated substrate is heated, as above described, to promote chemical bonding through oxo linkages. Afterwards, unbonded or uncross-linked complex is removed by a simple water wash.

It should be understood that the organo portion of the complexed molecule may become bonded with the polymeric constituent and/or the sensitizer or other additive of the photoresist material. Thus, the organo portion is not limited to any one structure or functional group, but rather can be chosen from the many different organic groups that are capable of reacting with the photoresist material. The methacrylic acid group of the methacrylato chromic chloride (in isopropanol) represented by the formula above is, therefore, exemplary only.

Other examples of suitable organic groups are those from the following acids:

Linoleic acid
Trichloroacetic acid
Vinyl acetic acid
Sorbic acid
Gallic acid (particularly suitable when used with a photoresist containing an azido sensitizer)

The organo portion of the complexed molecule in addition to being capable of bonding with the photoresist material, should not be of a chain length that renders the complex essentially water insoluble since interference with cation formation results. Organo portion chain lengths as long as 18 carbons have proved successful.

Bonding of the organo group of the complex to the photoresist material generally is accomplished during the drying step which normally follows the application of photoresist to any substrate.

After formation of the oxo linkages, the substrate, with its bonded complexed layer, is ready to receive the photoresist, which is applied in the usual manner.

The photoresists that are compatible with the inventive method may be either positive or negative types commercially available. Typical of the negative photoresists are those employing polymeric cinnamic acid esters or isobutylene and, respectively, polynuclear quinone or aromatic azide sensitizers. Exemplary positive resists are those containing alkali-soluble phenol-formaldehyde resins, and ortho-quinone diazido sensitizers.

Moreover, the complexing atom need not be chromium, but can be any other capable of carrying an appropriate organo group for reaction with the photoresist, and capable of electrostatically migrating to the substrate for the formation of strong chemical bridges therewith. Cobalt and platinum are promising examples.

What is claimed is:

1. The process of increasing the adherence of a photoresist material to a substrate comprising the steps of applying to the substrate a solution consisting essentially of a Werner-type complexed compound in the presence of sufficient water for ionizing at least some of the compound, where the complexing atom is capable of forming an oxo bridge with the substrate and at least one substituent of the compound is an organo group capable of reacting with the photoresist material, heating the substrate to promote oxo bridge formation, applying the photoresist material so as to produce a layer of the said photoresist in contact with a surface consisting essentially of the said Werner-type complexed compound and in which part of the photoresist material and Werner-type complexed compound are removed to expose a corresponding part of the substrate.

2. The process of claim 1 wherein the complexing atom is selected from the group consisting of chromium, cobalt and platinum, and the organo substituent is derived from at least one of the acids selected from the group consisting of methacrylic acid, linoleic acid, trichloroacetic acid, vinyl acetic acid and sorbic acid.

3. The process of claim 2 wherein the complex solution contains from 0.01 to 1.0 weight percent of the complex, at least about one percent by volume water and has a maximum pH of about 6, wherein the substrate consists essentially of a material selected from the group consisting of gold, platinum and the oxides of silicon and aluminum as well as mixtures and mixed compounds of silicon oxide and aluminum oxide with each other and with $P_2O_5$, $B_2O_3$, and $Si_3N_4$.

4. The process of claim 2 wherein the complex is a methacrylic acid derivative of chromic chloride in isopropanol.

5. The process of claim 4 wherein the substrate is heated in an essentially oxygen-less ambient.

6. The process of claim 4 wherein the substrate is platinum and the ambient includes some hydrogen.

7. The process of claim 6 wherein hydrogen is present in an amount about 0.3 percent by volume.

8. The process of claim 1 in which the steps of heating the substrate and applying the photoresist material are carried out in sequence.

9. The process of claim 1 in which further processing is done on the corresponding part of the substrate exposed by removal of the photoresist material and Werner-type complexed compound.

10. The process of claim 9 in which further processing includes removal of material by etching.

11. The process of claim 1 in which the photoresist material and Werner-type complexed compound is ultimately removed.

References Cited

UNITED STATES PATENTS

| | | | |
|---|---|---|---|
| 3,117,865 | 11/1964 | Crawford et al. | 96—85 |
| 2,960,415 | 11/1960 | Polan | 117—33.3 |
| 3,520,683 | 7/1970 | Kerwin | 96—36 X |
| 3,364,059 | 11/1968 | Marzocchi | 117—126 GS X |
| 3,261,285 | 7/1966 | Sorkin | 101—149.2 |

EDWARD G. WHITBY, Primary Examiner

U.S. Cl. X.R.

96—36, 87, 89; 117—212, 38, 123 B, 124 D, 132 R, 160 R; 156—3, 13